US006352942B1

(12) United States Patent
Luan et al.

(10) Patent No.: US 6,352,942 B1
(45) Date of Patent: Mar. 5, 2002

(54) OXIDATION OF SILICON ON GERMANIUM

(75) Inventors: Hsin-Chiao Luan, Cambridge; Lionel C. Kimerling, Concord, both of MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/603,269

(22) Filed: Jun. 23, 2000

Related U.S. Application Data

(60) Provisional application No. 60/141,142, filed on Jun. 25, 1999.

(51) Int. Cl.$^7$ ............................................... H01L 21/31
(52) U.S. Cl. ....................................................... 438/770
(58) Field of Search ................................ 438/378, 162, 438/285, 478, 522, 770, 787, 795, 911, 743, 752, 753

(56) References Cited

U.S. PATENT DOCUMENTS

| | | | |
|---|---|---|---|
| 4,604,304 A | 8/1986 | Faraone et al. | 427/255 |
| 4,814,291 A | 3/1989 | Kim et al. | 437/101 |
| 4,876,210 A | 10/1989 | Barnett et al. | 437/5 |
| 4,987,095 A | 1/1991 | Batey et al. | 437/106 |
| 5,089,428 A | * 2/1992 | Verret et al. | 437/31 |
| 5,268,324 A | 12/1993 | Aitken et al. | 437/57 |
| 5,616,515 A | * 4/1997 | Okuno | 438/478 |

FOREIGN PATENT DOCUMENTS

| | | | |
|---|---|---|---|
| EP | 0397987 | 11/1990 | H01L/29/76 |
| GB | 2131407 | 6/1984 | C01B/33/113 |

OTHER PUBLICATIONS

Vitkavage et al., "Gating of germanium surfaces using pseudomorphic silicon interlayers," *Appl. Phys. Lett.*, vol. 53, No. 8, pp. 692–694, Aug. 1988.

Patent Abstracts of Japan, Nippon Telegr. & Teleph. Corp., vol. 013, No. 539 (E–853), Nov. 1989.

Moslehi, et al., "Low–temperature in–situ dry cleaning process for epitaxial layer multiprocessing," in Rapid Thermal And Related Processing Techniques, Santa Clara, CA, Oct. 1990, Proceedings of the SPIE, vol. 1393, pp. 90–108, 1990

Freeouf et al., "Studies of GaAs–oxide interfaces with and without Si interlayer," *J. Vac., Sci., Technol. B,* vol. 8, No. 4, pp. 860–866, Jul./Aug. 1990.

Hattangady et al., "The role of an ultrathin silicon interlayer at the $SiO^2$–Ge interface," *J. Appl. Phys.*, vol. 71, No. 8, pp. 3842–3852, Apr. 1992.

(List continued on next page.)

*Primary Examiner*—David Nelms
*Assistant Examiner*—Quoc Huang
(74) *Attorney, Agent, or Firm*—Theresa A. Lober

(57) ABSTRACT

The invention provides processes for producing a high-quality silicon dioxide layer on a germanium layer. In one example process, a layer of silicon is deposited on the germanium layer, and the silicon layer is exposed to dry oxygen gas at a temperature that is sufficient to induce oxidation of the silicon layer substantially only by thermal energy. In a further example process, the silicon layer is exposed to water vapor at a temperature that is sufficient to induce oxidation of the silicon layer substantially only by thermal energy. It can be preferred that the exposure to dry oxygen gas or to water vapor be carried out in an oxidation chamber at a chamber pressure that is no less than ambient pressure. In one example, the chamber pressure is above about 2 atm. The temperature at which the silicon layer is exposed to the dry oxygen gas is preferably above about 500° C., more preferably above about 600° C., even more preferably above about 700° C., and most preferably above about 800° C.

17 Claims, 5 Drawing Sheets

OTHER PUBLICATIONS

Kosowsky et al., "An X–ray scattering study of $SiO_x$/Si/Ge(001)," *Applied Surface Science,* vol. 84, No. 2, pp. 179–185, Feb. 1995.

Kuznetsov et al., "Composition of Strain Relaxation of Si/SiGe/Si Heterostructures after Annealing in Oxidizing and Inert Atmospheres," Proc. of the 18th Nordic Semiconductor Meeting, Linkoping, Sweden, Jun. 1998; and *Physica Scripta,* vol. T79, pp. 202–205, 1999.

Wang et al., "Plasma nitridation of thin Si layers for GaAs dielectrics," *J. Vac. Sci. Technol. B,* vol. 17, No. 5, pp. 2034–2039, Sep./Oct., 1999.

* cited by examiner

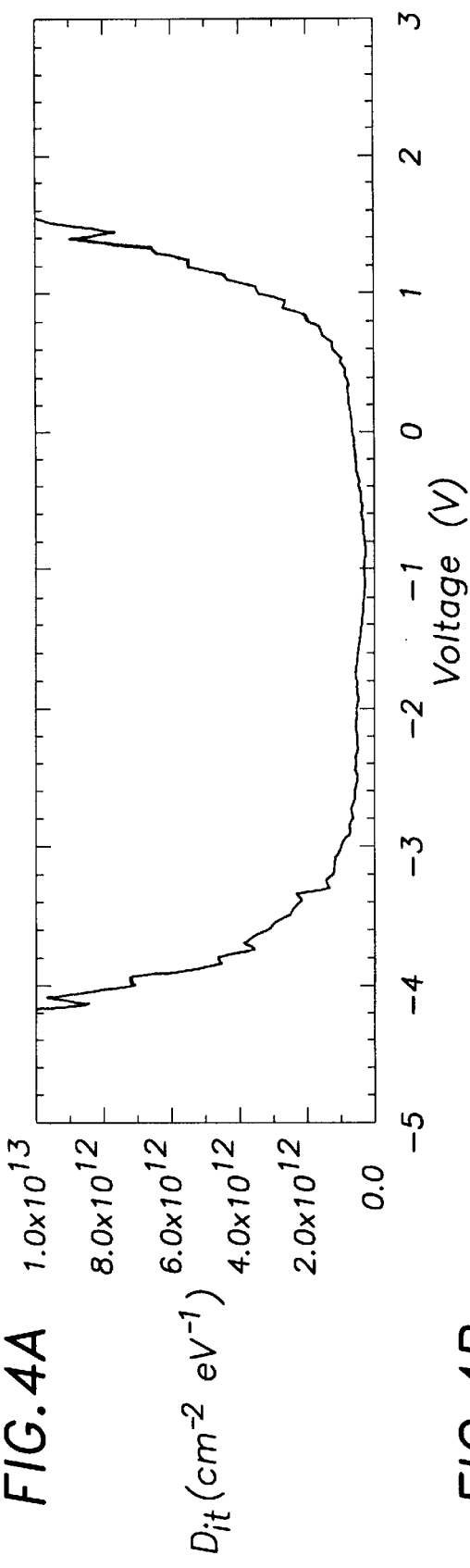
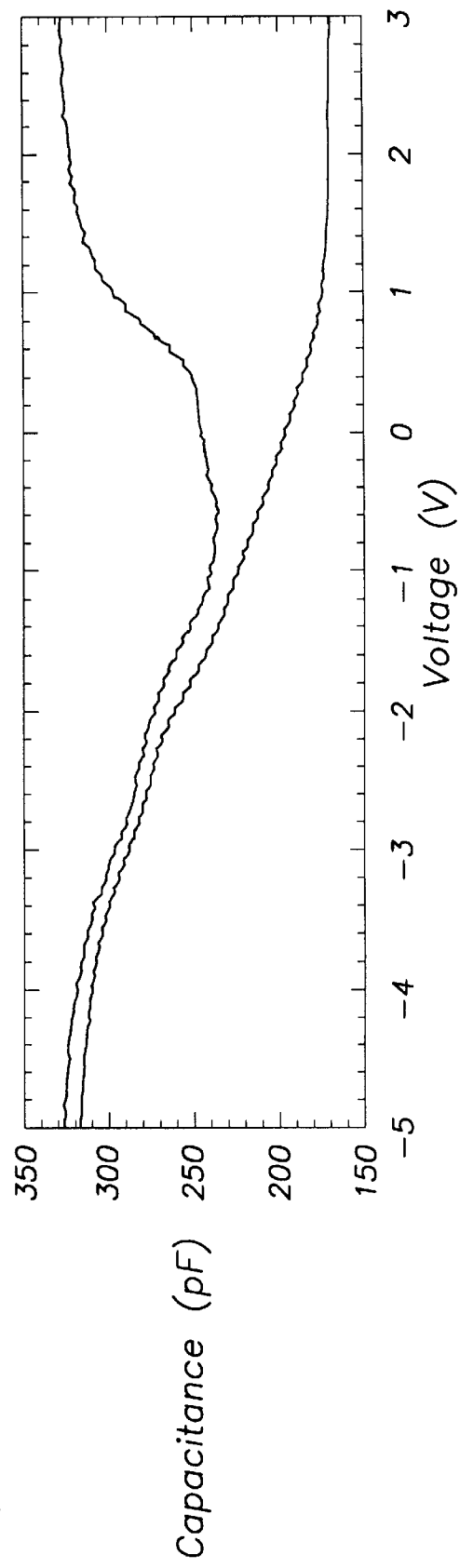
FIG.4A
FIG.4B

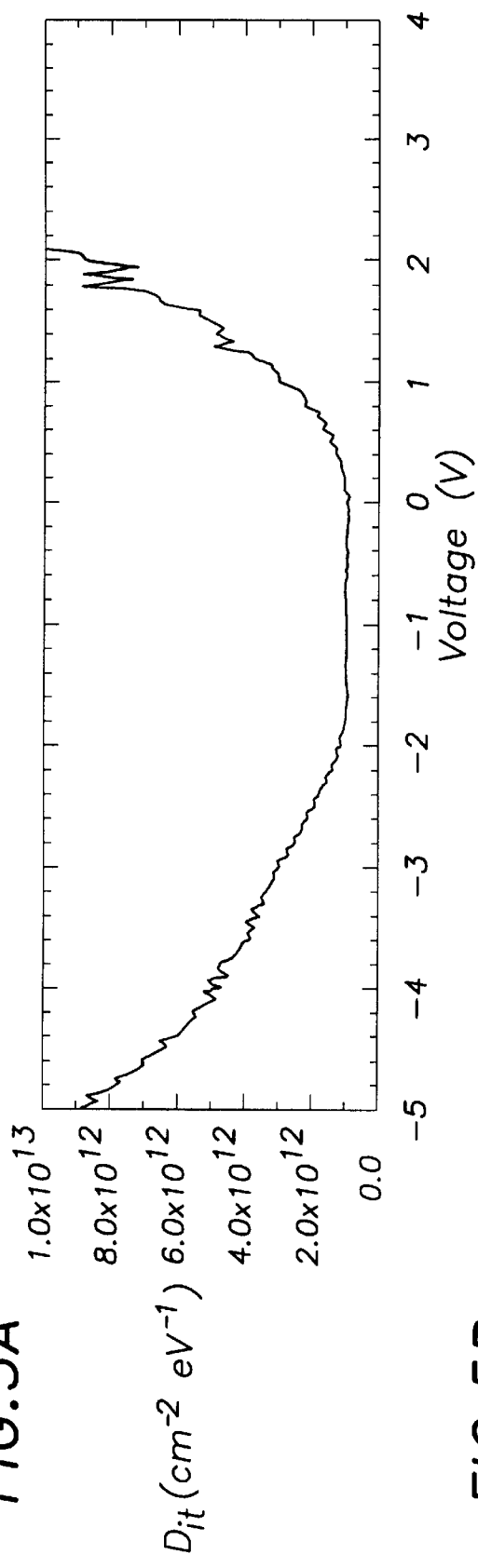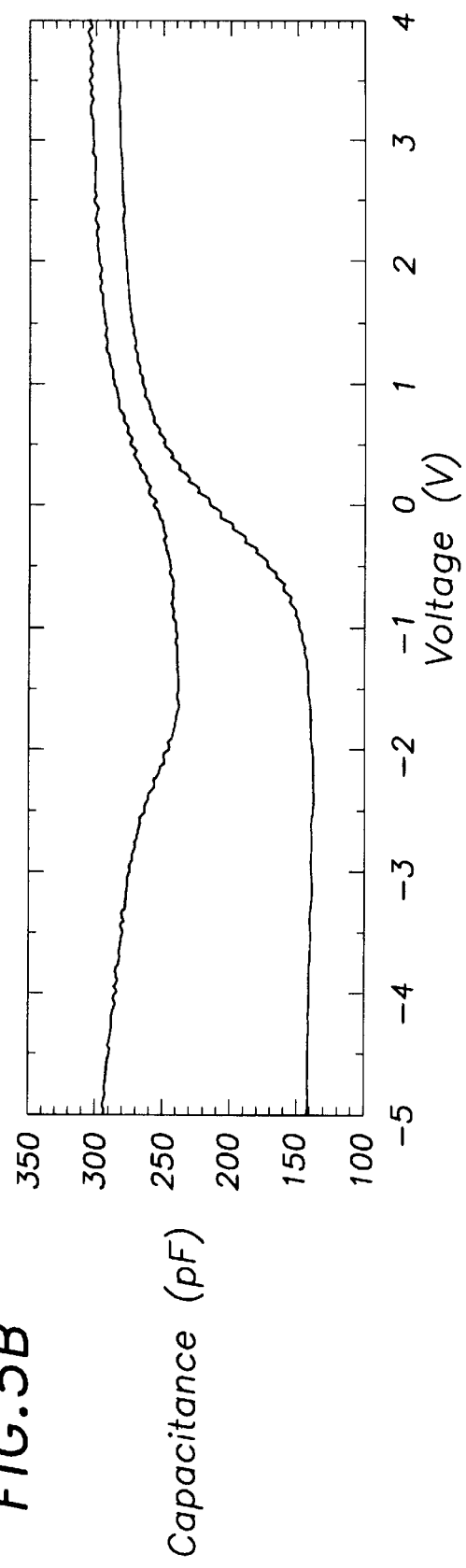
FIG. 5A
FIG. 5B

OXIDATION OF SILICON ON GERMANIUM

This application claims the benefit of U.S. Provisional Application No. 60/141,142, filed Jun. 25, 1999, the entirety of which is hereby incorporated by reference.

CROSS REFERENCE TO RELATED APPLICATION

This application is related to co-pending application entitled "Cyclic thermal Anneal For Dislocation Reduction," filed on even date herewith and incorporated by reference in its entirety.

BACKGROUND OF THE INVENTION

This invention relates to metal-oxide-semiconductor (MOS) structures formed on a semiconductor layer, such as germanium, and more particularly relates to a method of forming an insulating layer on a germanium layer.

Integration of germanium (Ge)-based electronic devices such as near-infrared photodetectors and near-infrared phototransistors on a silicon (Si) substrate is recognized as an important technological challenge for enabling improvements in the functionality of Si integrated circuits. Two particular and related difficulties in the integration of Ge with a silicon device fabrication sequence are posed by the high chemical activity of Ge in conventional Si wafer cleaning chemistry and the inability to oxidize Ge directly to form a robust, high-quality oxide layer.

Conventionally, electronic devices on a silicon substrate are protected during various cleaning processes by a layer of silicon dioxide ($SiO_2$) formed by, e.g., chemical vapor deposition (CVD) or plasma enhanced chemical vapor deposition (PECVD). Ge is very highly reactive with most conventional Si cleaning chemicals and therefore any Ge layers produced on a Si substrate must be well-shielded from cleaning steps carried out in a Si fabrication sequence. Although there are well-developed techniques for depositing a layer of $SiO_2$ by CVD or PECVD on a Ge layer, such layers cannot, in practice, be exploited as both a shield against cleaning processes and as the oxide layer in a MOS structure formed on a Ge layer. This is due to the characteristically poor electrically qualities of CVD and PECVD oxide layers.

Specifically, $SiO_2$ deposited by CVD or PECVD typically contains hydrogen and/or chlorine, resulting in a relatively low dielectric strength. Furthermore, such films are generally characterized by a high density of trapped electrical charges. These well-known limitations of CVD and PECVD $SiO_2$ films have led to the universal use of thermally-grown, rather than deposited, $SiO_2$ films as the gate oxide in silicon MOS structures and devices. It is not possible, however, to thermally oxidize germanium in the manner of silicon to produce a useful dielectric layer. This process obstacle has been addressed by various proposed processes for depositing a CVD or PECVD $SiO_2$ film on Ge in a manner that minimizes the deleterious characteristics of the film.

It has been recognized that whatever the quality of a $SiO_2$ film itself, the $SiO_2$film/Ge interface is generally characterized by a high density of electrical interface states. Such can result in a high surface leakage current when a P-N junction is terminated at the interface. The electrical qualities of the interface are generally so poor as to not be suitable for fabrication of MOS devices. It has been proposed to alleviate this condition and to produce a relatively higher quality $SiO_2$ layer on Ge by inserting a layer of Si of low thickness, e.g., less than about 2 nm in thickness, between a PECVD $SiO_2$ film and the Ge layer. Although the use of a Si interlayer has been shown to improve interface characteristics, it does not generally improve the quality of the PECVD $SiO_2$ film.

Thus, the quality of $SiO_2$ films produced by current, conventional CVD and PECVD processes are generally far below the quality required for gate oxide films in Si CMOS technology; only gate oxide films produced by thermal oxidation are commercially viable. As a result, in a conventional fabrication sequence employing both Si and Ge, a CVD or PECVD oxide deposition process is required for the Ge regions, and a thermal oxide growth process is required for the Si regions. This duplication in oxide formation processes results in lower throughput and higher cost, and reduces the commercial viability of the Si-Ge fabrication.

SUMMARY OF THE INVENTION

The invention provides processes for producing a high-quality silicon dioxide layer on a germanium layer. In one example process, a layer of silicon is deposited on the germanium layer, and then the silicon layer is exposed to dry oxygen gas at a temperature that is sufficient to induce oxidation of the silicon layer substantially only by thermal energy. In a further example process, the silicon layer is exposed to water vapor at a temperature that is sufficient to induce oxidation of the silicon layer substantially only by thermal energy.

For many applications, it can be preferred that the exposure to dry oxygen gas or to water vapor be carried out in an oxidation chamber at a chamber pressure that is no less than ambient pressure. In one example, the chamber pressure is above about 2 atm. The temperature at which the silicon layer is exposed to the dry oxygen gas is preferably above about 500° C., more preferably above about 600° C., even more preferably above about 700° C., and most preferably above about 800° C.

The exposure to dry oxygen gas can be carried out for a duration of time selected to oxidize substantially the entire silicon layer or alternatively, for a duration of time selected to oxidize a portion of the silicon layer. The silicon layer can be of a thickness of, e.g., between about 5 angstrom and about 500 nanometer. The un-oxidized portion of the silicon layer preferably is at least about one silicon monolayer thick.

In processes provided by the invention, a first step can be carried out to grow the germanium layer on a silicon substrate. Desorption of native oxide of the germanium layer can be carried out prior to the silicon layer deposition. The silicon layer deposition can be carried out in situ with and following the germanium growth. The germanium layer and the silicon layer can each be deposited in an ultra high vacuum chamber by chemical vapor deposition.

After the oxidation process, the oxidized silicon layer can be annealed in accordance with the invention. An electrically conductive element can be formed on the oxidized silicon layer; for example, a metal layer can be deposited on the oxidized silicon layer. This enables the formation of MOS structures and devices for a wide range of applications in a manner that is commercially viable.

Other features and advantages of the invention will be apparent from the following description and the accompanying drawings, and from the claims.

BRIEF DESCRIPTION OF THE DRAWINGS

FIGS. 4A–4B are plots of measured interface state density as a function of voltage and capacitance as a function of voltage, respectively, of a MOS structure of metal-silicon dioxide-silicon-germanium on a $p^+$ silicon substrate fabricated in accordance with the invention; and FIGS. 5A–B are plots of measured interface state density as a function of voltage and capacitance as a function of voltage, respectively, of a MOS structure of metal-silicon dioxide-silicon-germanium on a $p^+$ silicon substrate fabricated in accordance with the invention.

DETAILED DESCRIPTION OF THE INVENTION

Figure 1A:
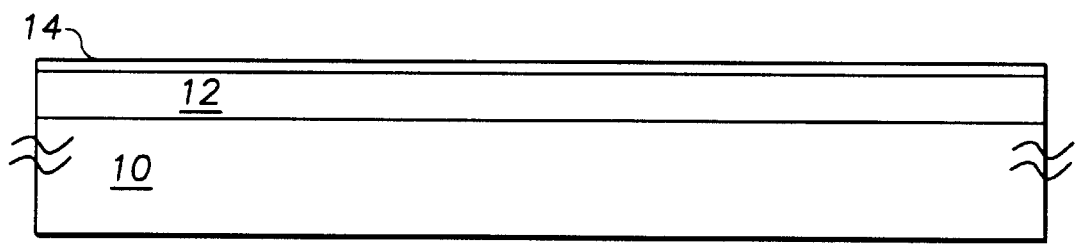
FIGS. 1A–1C are schematic cross-sectional views of the materials employed in formation of a silicon dioxide film in accordance with the invention.

Referring to FIG. 1A, in formation of the silicon dioxide layer of the invention, a substrate 10, for example a silicon substrate, is provided. A Ge layer 14 is grown on the silicon substrate in any suitable manner. In one process preferred in accordance with the invention, a Ge layer is grown by a two-step ultra high vacuum chemical vapor deposition (UHV/CVD) process, the first deposition step at a lower temperature and growth rate than the second. A UHV/CVD chamber for carrying out the Ge growth, and suitable Ge growth parameters, are taught by Luan et al. in the copending application entitled "Cyclic Thermal Anneal for Dislocation Reduction," filed on even date herewith, and hereby incorporated in its entirety by reference.

The invention contemplates the provision of a starting Ge layer in other manners. For example, a Ge layer formed by molecular beam epitaxy, by conventional chemical vapor deposition, by rapid thermal chemical vapor deposition, by chemical beam epitaxy or other epitaxial processes, by thermal evaporation, or by other suitable growth or deposition process. Alternatively, the Ge layer can be formed as part of a hybrid substrate structure, for example by bonding a Ge layer on a Si substrate or bonding a Ge layer on a silicon-on-insulator substrate or other such configuration.

With a selected Ge layer formed, a Si epi-layer 14 is then deposited on the Ge layer. In accordance with the invention, to ensure the highest quality Si/Ge interface, it can be preferred to deposit the Si layer in situ in a Ge growth chamber immediately after Ge layer growth, if such is the selected Ge formation process. If this is not possible or not preferred, it is then preferred to clean the Ge layer surface prior to Si deposition by, e.g., a wet clean such as an $H_2O_2$ clean followed by an HF dip. Preferably this wet clean is carried out several times to etch several surface layers of Ge.

To further improve the Si/Ge interfacial qualities, after wet cleaning, it can be preferred to desorb native oxide from the Ge epi-layer. This can be carried out, e.g., by heating the Ge layer in a vacuum or inert environment, e.g., in a UHV/CVD chamber, at a temperature between about 500° C. and about 900° C. A preferred temperature can be about 850° C. If the highest quality Ge surface is preferred, a thin Ge epi-layer can be deposited on the initial Ge layer by exposing the Ge layer to a flow of $GeH_4$ at 600° C., e.g., in a UHV/CVD chamber like that described above.

Deposition of a Si epi-layer of a selected thickness can be carried out in any suitable CVD environment, e.g., a UHV/CVD chamber. Here the $SiH_4$ flow rate can be, e.g., between about 5 sccm and about 100 sccm, with a flow rate of about 20 sccm preferable. The Si growth temperature can be, e.g., between about 500° C. and about 700° C., with a temperature of about 600° C. preferable. A deposition pressure of about 30 mTorr is preferable. The Si growth rate at about 600° C. is about 30 nm/hr.

The invention contemplates a wide range of alternative Si layer deposition processes. For example, chemical beam epitaxy, rapid thermal CVD or atmospheric CVD, and other such suitable deposition processes can be employed. Whatever process is employed, it preferably is carried out on a highly-clean Ge surface under deposition conditions that result in a flat Si layer on the Ge surface.

EXAMPLE 1

A Si layer of about 35 nm in thickness was deposited on a Ge layer of about 1 μm in thickness, grown on a p-type Si substrate (001) by a UHV/CVD process. The Si layer growth was carried out in situ immediately at the end of Ge growth by interrupting flow of $GeH_4$ while commencing flow of $SiH_4$. The Si deposition temperature was maintained at about 600° C. and 20 sccm of $SiH_4$ was flowed for about 1 hour. This resulted in a deposition reaction regime that was surface reaction controlled, in a manner preferable for producing a substantially flat silicon layer.

Figure 2:
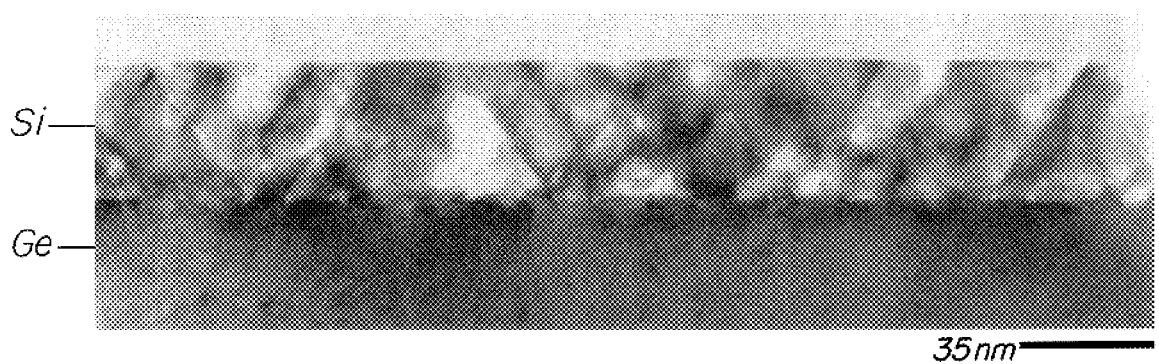
FIG. 2 is a cross-sectional transmission electron micrograph of a silicon layer deposited on a germanium layer in accordance with the invention.

FIG. 2 is a cross-sectional TEM of the Si layer grown on the Ge epi-layer. The underlying Si substrate is not shown. It can be observed in the TEM of FIG. 2 that a smooth, continuous Si surface is formed on the Ge layer.

Once a Si layer of a selected thickness is formed on the Ge layer, the Si/Ge/Si structure is then preferably cleaned, e.g., in a conventional Si wafer cleaning chemistry such as an RCA clean or a Piranha cleaning process. If an RCA clean is selected, it is preferable to calibrate the etch rate of Si in the SC-1 clean step, which consists of $NH_4OH$, $H_2O_2$ and $H_2O$, to ensure that the Si layer is of sufficient thickness to withstand the step in protecting the Ge layer throughout the SC-1 cleaning process. If such is a concern, then alternatively, the SC-1 clean step can be replaced by a Piranha clean step. Other cleaning processes are contemplated by the invention.

Figure 1B:
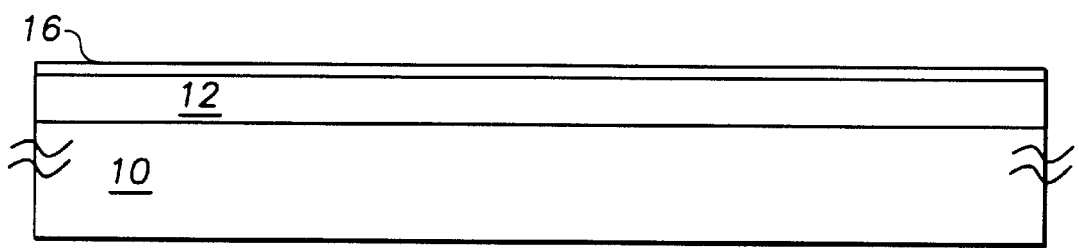

Referring to FIG. 1B, in accordance with the invention, after cleaning, the silicon layer is oxidized by a thermal oxidation process that is either dry, i.e., by heating in a flow of dry oxygen gas, or wet, i.e., by heating in a flow of steam. This oxidation of the silicon layer produces a silicon dioxide layer 16 on the Ge epi-layer. A conventional, atmospheric oxidation furnace can be employed for oxidation at ambient pressure or higher, and if desired, a high-pressure oxidation furnace can be employed for oxidation at pressures of between about 1–20 atm. In either case, the Si oxidation is to be induced substantially solely by thermal energy. In other words, no plasma environment is to be present during the oxidation. In addition, no silicon deposition gases, e.g., $SiH_4$ are to be flowed during the oxidation.

The temperature of the oxidation process is preferably above about 500° C., and for a dry oxidation process, is more preferably above about 750° C. Because the silicon oxidation rate is relatively low for temperatures between about 500° C. and 750°, high-pressure oxidation can be preferred if a temperature within this range is to be employed.

Figure 1C:
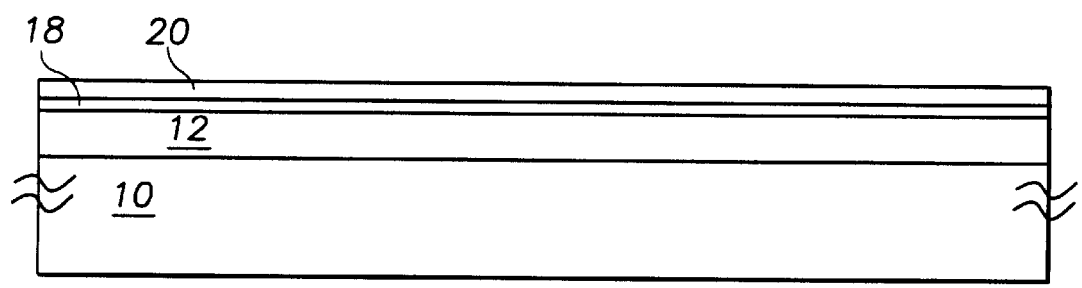

The oxidation process can be carried out until the silicon layer is completely oxidized, resulting in the structure of FIG. 1B, or can be terminated at an intermediate duration, resulting in the structure of FIG. 1C, which includes a Si layer 18 of a thickness less than its as-deposited thickness and an upper silicon dioxide layer 20. Such a configuration can be desired when, e.g., the quality of the interface between a silicon dioxide layer and an underlying Ge layer are expected to be inferior for a given application. It is recognized that the starting Si layer thickness is to be selected based on the oxide and Si thicknesses desired to be produced by the oxidation.

The selected oxidation process can be carried out directly in the manner prescribed for conventional Si CMOS oxidation processes, employing the temperatures and flow rates of such processes. For example, in a dry oxidation process, the flow of dry oxygen gas can vary and is not critical; the $O_2$ flow rate preferably is about several hundred sccm. A wet oxidation process can be carried out by flowing an inert gas through a water tank to produce a flow of steam in the conventional manner. For many applications, dry oxidation is preferred over wet oxidation due to the relatively better mechanical and electrical properties of a silicon dioxide film produced by dry oxidation.

Fixed charge density in the oxide layer can be reduced by a post oxidation anneal in the conventional manner for Si CMOS processing. For example, the structure can be annealed in an inert atmosphere such as argon at a pressure of, e.g., abut 1 atm, for about 30 minutes.

EXAMPLE 2

Dry oxidation of a thin silicon layer of about 35 nm in thickness deposited on a Ge epi-layer of about 1 $\mu$m in thickness was carried out at a temperature of about 850° C. with a flow of dry $O_2$ gas at a pressure of about 1 atm for about 185 minutes. At the end of the oxidation process the whole structure was annealed in dry Ar gas at a temperature of about 850° C. at a pressure of about 1 atm for about 30 minutes to reduce fixed oxide charge density. This oxidation process produced about 20 nm of $SiO_2$.

Figure 3:
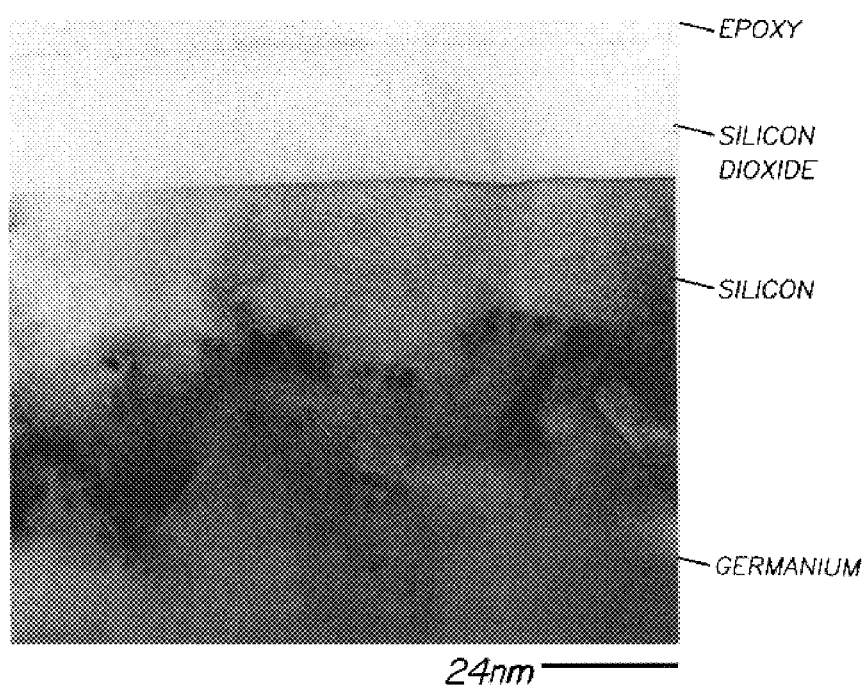
FIG. 3 is a cross-sectional transmission electron micrograph of a silicon layer that has been partially-oxidized, provided on a germanium layer in accordance with the invention.

FIG. 3 is a cross-sectional TEM of the resulting structure. The upper layer of epoxy was applied for attaching the sample to a holder. The TEM clearly indicates a smooth $SiO_2$/Si interface. The Si/Ge surface is shown to not be smooth. This condition resulted from thermal stress and interdiffusion between Ge and Si. It is recognized in accordance with the invention that this interdiffusion can be reduced by carrying out the oxidation process at the same temperature employed for the Si layer deposition on the underlying Ge epi-layer.

Once the selected oxide-silicon-germanium or oxide-germanium structure is formed, an electrically-conducting element such as a metal electrode can then be deposited and patterned by conventional techniques, and the resulting structure subjected to additional heat treatment as desired for reducing interface state density in the conventional manner. The resulting MOS structure can then be employed in electronic and optoelectronic devices.

EXAMPLE 3

The quality of the oxide/semiconductor interface can be characterized by measuring the capacitance-voltage (C-V) characteristics of a MOS structure formed with the oxide layer of the invention. A MOS structure was fabricated by thermally evaporating aluminum on an $SiO_2$/Si/Ge structure grown on a $p^+$ Si substrate and on a $n^+$ Si substrate, with the Si and Ge thicknesses of Example 2.

FIG. 4A is a plot of calculated interface state density of the MOS structure on the $p^+$ substrate, as a function of voltage, and FIG. 4B is a plot of capacitance as a function of voltage (C-V curves). Both the high frequency and low frequency C-V curves clearly demonstrate accumulation, depletion and inversion behavior as-required for device operation. The interface state density was calculated from the difference between the high frequency and low frequency C-V curves. The lowest interface state density measured was about $1.2 \times 10^{11}$ $cm^{-2}eV^{-1}$.

FIG. 5A is a plot of calculated interface state density of the MOS structure formed on an $n^+$ silicon substrate, as a function of voltage, and FIG. 5B is a plot of capacitance as a function of voltage (C-V curve) for this structure. As indicated by the plots, this structure also demonstrated clear accumulation, depletion and inversion behavior. The lowest interface density measured was about $9.8 \times 10^{11}$ $cm^{-2}eV^{-1}$.

The oxidation processes of the invention enable true integration of Ge epi-layers and devices with Si CMOS processes. CMOS oxidation processes, including a dry thermal gate oxidation process, can be directly applied to Ge layers in accordance with the invention to produce an oxide layer for protection during Si cleaning processes and to produce the dielectric layer of a Ge MOS structure. The oxidation processes of the invention accommodate complete oxidation of a silicon layer to form an oxide layer immediately adjacent to a Ge surface, and accommodate partial oxidation of the silicon layer to form an oxide-silicon-germanium structure. This enables formation of a high-quality oxide-semiconductor interface.

The mechanical and electrical characteristics of the thermal oxide produced in accordance with the invention far surpass that of CVD or PECVD oxides, and do so without the need for non-standard process steps during an SI CMOS fabrication sequence incorporating Ge devices. The commercial viability of Ge device integration with Si electronics is thereby enabled by the invention.

It is recognized, of course, that those skilled in the art may make various modifications and additions to the processes of the invention without departing from the spirit and scope of the present contribution to the art. Accordingly, it is to be understood that the protection sought to be afforded hereby should be deemed to extend to the subject matter of the claims and all equivalents thereof fairly within the scope of the invention.

We claim:

1. A method for forming a silicon dioxide layer on a germanium layer comprising the steps of:

depositing a layer of silicon on the germanium layer; and exposing the silicon layer to dry oxygen gas at an exposure temperature, of at least about 500° C., that is sufficient to induce oxidation of the silicon layer substantially only by thermal energy, for a duration of exposure time selected to oxidize only a portion of the silicon layer, an un-oxidized portion of the silicon layer remaining on the germanium layer and being at least about one silicon monolayer thick.

2. The method of claim 1 wherein the silicon layer exposure to dry oxygen gas is carried out at a temperature above about 600° C.

3. The method of claim 2 wherein the silicon layer exposure to dry oxygen gas is carried out at a temperature above about 700° C.

4. The method of claim 3 wherein the silicon layer exposure to dry oxygen gas is carried out at a temperature above about 800° C.

5. The method of claim 1 wherein the silicon layer exposure to dry oxygen gas is carried out in an oxidation chamber at a chamber pressure that is no less than ambient pressure.

6. The method of claim 5 wherein the silicon layer exposure to dry oxygen is carried out at a chamber pressure above about 2 atm.

7. The method of claim 1 further comprising a last step of annealing the oxidized silicon layer.

8. The method of claim 1 further comprising a first step of growth of the germanium layer on a silicon substrate.

9. The method of claim 8 wherein the silicon layer deposition is carried out in situ with and following the germanium growth.

10. The method of claim 8 further comprising a step of desorbing native oxide on the germanium layer before the silicon layer deposition.

11. The method of claim 8 wherein the germanium layer and the silicon layer are each deposited in an ultra high vacuum chamber by chemical vapor deposition.

12. The method of claim 1 further comprising a step of forming an electrically conductive element on the oxidized silicon layer.

13. The method of claim 12 wherein the step of forming an electrically conductive element comprises depositing a metal layer.

14. A method for forming a silicon dioxide layer on a germanium layer comprising the steps of:

depositing a layer of silicon on the germanium layer; and exposing the silicon layer to water vapor at an exposure temperature, of at least about 500° C., that is sufficient to induce oxidation of the silicon layer substantially only by thermal energy, for a duration of exposure time selected to oxidize only a portion of the silicon layer, an un-oxidized portion of the silicon layer remaining on the germanium layer and being at least about one silicon monolayer thick.

15. The method of claim 14 wherein the silicon layer exposure to water vapor is carried out in an oxidation chamber at a chamber pressure that is no less than ambient pressure.

16. A method for forming a silicon dioxide layer on a germanium layer comprising the steps of:

depositing a layer of silicon on the germanium layer; and exposing the silicon layer to dry oxygen gas at the silicon deposition temperature for a duration of exposure time selected to oxidize only a portion of the silicon layer, an un-oxidized portion of the silicon layer remaining on the germanium layer and being at least about one silicon monolayer thick.

17. A method for forming a silicon dioxide layer on a germanium layer comprising the steps of:

depositing a layer of silicon on the germanium layer; and exposing the silicon layer to water vapor at the silicon deposition temperature for a duration of exposure time selected to oxidize only a portion of the silicon layer, an un-oxidized portion of the silicon layer remaining on the germanium layer and being at least about one silicon monolayer thick.

* * * * *